United States Patent
Gao

(10) Patent No.: US 10,820,452 B2
(45) Date of Patent: Oct. 27, 2020

(54) CONTROL AND OPTIMIZATION OF INDIRECT EVAPORATIVE COOLING UNITS FOR DATA CENTER COOLING

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 47 days.

(21) Appl. No.: 16/028,341

(22) Filed: Jul. 5, 2018

(65) Prior Publication Data

US 2020/0015389 A1    Jan. 9, 2020

(51) Int. Cl.

| | |
|---|---|
| *F24F 13/14* | (2006.01) |
| *H05K 7/20* | (2006.01) |
| *F24F 11/80* | (2018.01) |
| *F24F 3/048* | (2006.01) |
| *F25B 39/02* | (2006.01) |
| *F24F 5/00* | (2006.01) |
| *F24F 110/10* | (2018.01) |

(52) U.S. Cl.
CPC ......... *H05K 7/20836* (2013.01); *F24F 3/048* (2013.01); *F24F 5/0035* (2013.01); *F24F 11/80* (2018.01); *F25B 39/02* (2013.01); *H05K 7/20745* (2013.01); *F24F 13/14* (2013.01); *F24F 2110/10* (2018.01); *F25B 2339/021* (2013.01)

(58) Field of Classification Search
CPC .......... H05K 7/20745; H05K 7/20836; H05K 7/20709
See application file for complete search history.

(56) References Cited

U.S. PATENT DOCUMENTS

| | | | |
|---|---|---|---|
| 2009/0088873 A1* | 4/2009 | Avery | G06F 1/206 700/51 |
| 2011/0189936 A1* | 8/2011 | Haspers | A47B 81/00 454/184 |
| 2013/0061624 A1* | 3/2013 | Zwinkels | H05K 7/1497 62/259.4 |
| 2014/0190198 A1* | 7/2014 | Slessman | H05K 7/20836 62/314 |
| 2016/0192542 A1* | 6/2016 | LeFebvre | H05K 7/20827 361/679.47 |
| 2019/0159365 A1* | 5/2019 | Snip | E04B 5/48 |

* cited by examiner

*Primary Examiner* — Filip Zec
(74) *Attorney, Agent, or Firm* — Womble Bond Dickinson (US) LLP

(57) ABSTRACT

Embodiments of the present invention provide control solutions for data center thermal management and control using an IDEC system. The data center is arranged in a cold air room wall supply and hot air room wall return configuration. The sensors, such as temperature sensors and/or pressure sensors, are utilized to measure and record thermal data. The data is then processed and used to control the IDEC system to adjust operating conditions to satisfy dynamic thermal requirements of the data center. The control functions include: 1) controlling the IDEC system to adjust cooling modes and operating conditions as needed to maintain proper data center thermal environment; and 2) identifying different optimal operating conditions and parameters for the IT room and IDEC system.

16 Claims, 12 Drawing Sheets

| Operating Modes | Air Cooling | Evaporative Cooling | DX Cooling |
|---|---|---|---|
| Mode 1 | On | Off | Off |
| Mode 2 | On | On | Off |
| Mode 3 | On | Off | On |
| ... | ... | ... | ... |
| Mode N | On | On | On |

FIG. 10

CONTROL AND OPTIMIZATION OF INDIRECT EVAPORATIVE COOLING UNITS FOR DATA CENTER COOLING

FIELD OF THE INVENTION

Embodiments of the present invention relate generally to data centers. More particularly, embodiments of the invention relate to controlling and optimizing indirect evaporative cooling units for data centers.

BACKGROUND

Heat removal is a prominent factor in computer system and data center design. The number of servers deployed within a data center has steadily increased as server performance has improved, thereby increasing the amount of heat generated during the regular operation of the servers. The reliability of servers used within a data center decreases if the environment in which they operate is permitted to increase in temperature over time. A significant portion of the data center's power is used for removing the heat generated by the electronics packaged within the server. As the number of servers within a data center increase, a greater portion of the power is commensurately consumed by the data center to cool electronic components within the servers.

Indirect evaporative cooling/cooler (IDEC) is one of the popular cooling solutions for data centers. It can be understood as an economization solution which uses outside air or liquid to cool the data center air through air-to-air or liquid-to-air heat exchangers. In addition, IDEC uses evaporative cooling when the outside air dry-bulb temperature is not sufficiently low, in which it turns into a wet-blub temperature running mode. Direct expansion (DX) cooling is used during extreme ambient temperature conditions, such as hot summer days.

The control of an IDEC unit is critical for both cooling system and data center system reliability and energy efficiency. For IDEC unit, the automation involves the controlling of an internal blower/fans speed, an external blower/fans speed, an evaporative pump (e.g., on and off, speed), and DX operating condition. A control system is to adjust the operating conditions of the IDEC unit to maintain proper thermal environment in the data center information technology (IT) room. The data center IT room is under dynamic conditions most of the time. The thermal environment includes supply air temperature, supply air humidity, supply air flow rate/velocity and supply air quality. Maintaining these parameters within proper envelops are critical for server and IT normal operating and long-term reliability. The control becomes more critical when there are multiple IDEC units used in the system.

Most of existing solutions may not applicable to the actual data center building and room. The actual data center and building design are different from case to case. The function of the control system is maintaining and ensuring the thermal conditions including air temperature and air flow rate satisfying the requirements. Variations in any of these conditions may result in an impact on the other. The conventional solutions may not be a reliable and efficient one for the case described in this document.

BRIEF DESCRIPTION OF THE DRAWINGS

Embodiments of the invention are illustrated by way of example and not limitation in the figures of the accompanying drawings in which like references indicate similar elements.

FIG. 10 shows examples of operating modes of an IDEC system according to one embodiment.

DETAILED DESCRIPTION

Figure 1:
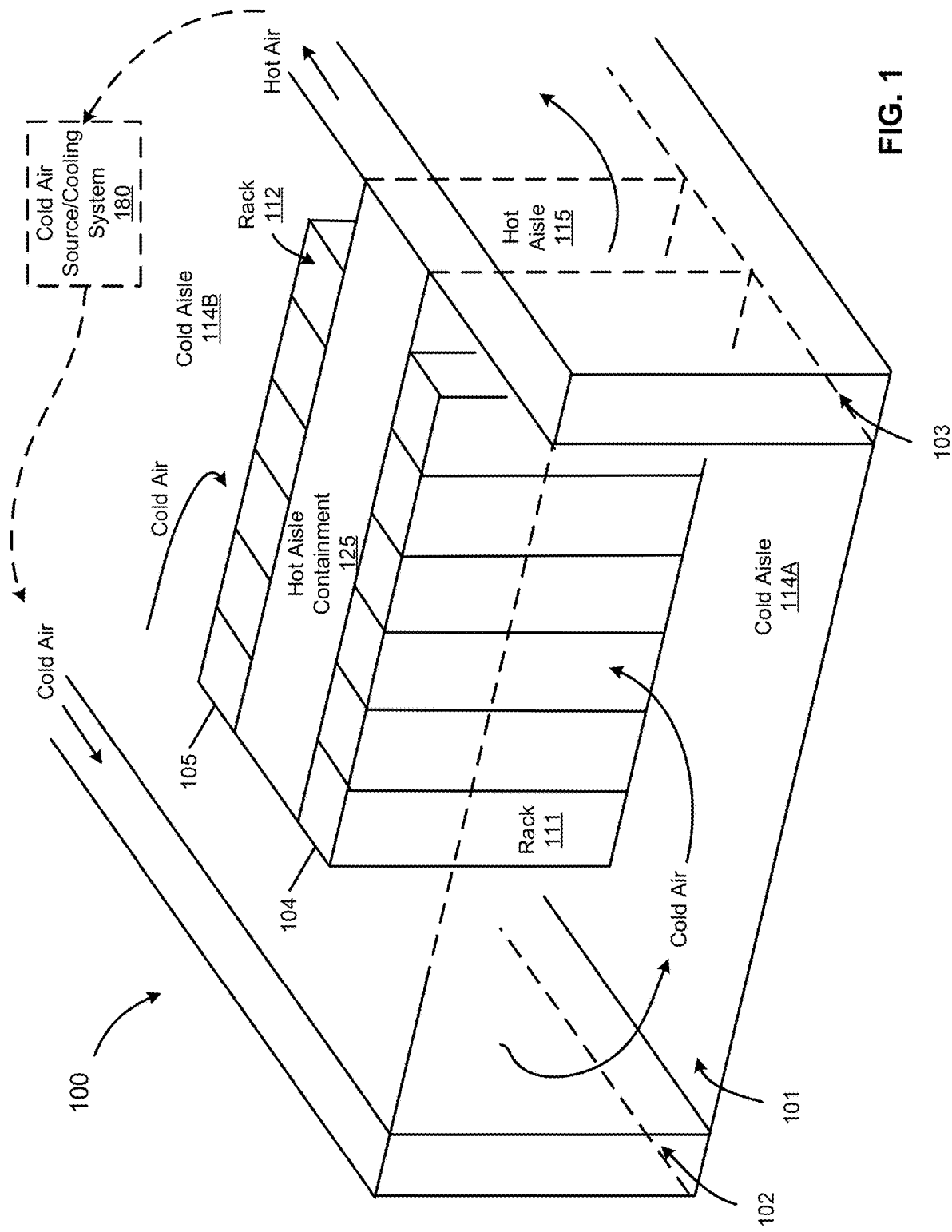
FIG. 1 shows a perspective view of a data center system according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the present invention provide control solutions for data center thermal management using an IDEC system. The data center is arranged in a cold air room wall supply and hot air room wall return configuration. The sensors, such as temperature sensors and/or pressure sensors, are utilized to measure and record thermal data. The data is then processed and used to control the IDEC system to adjust operating conditions to satisfy dynamic thermal requirements of the data center. The control functions include: 1) controlling the IDEC system to adjust operating conditions as needed to maintain proper data center thermal environment; and 2) identifying different optimal operating conditions and parameters for the IT room and IDEC system. The thermal management operations and optimization include monitoring and controlling cold air room (supply) thermal conditions and hot air room (return) thermal conditions, using cold air room and/or hot air room thermal data as control signals for the IDC systems; reducing the impact of variations in the IDEC system on the cooling air conditions supplied to the IT room; proper control design for the actual application scenarios; operating conditions optimization of the IDEC system; and reducing the impacts of hot air recirculation, operator activities on the room dynamics.

According to one aspect of the invention, a data center system includes an IT room to contain a number of electronic racks. Each electronic rack may contain a number of server blades and each server blade may contain one or more IT components (e.g., processors, memory, storage devices) that may generate heat during the operations. The data center system further includes a cold air room and a hot air room connected to the IT room. The cold air room is configured to receive cold air of an internal airflow from an IDEC unit and to distribute the cold air to the electronic racks of the IT room to exchange heat generated from the IT components of the electronic racks. The cold air room includes a first set of one or more temperature sensors to sense and measure the temperature of the cold air room. The hot air room is configured to receive hot air carrying the exchanged heat from the IT room and to return the hot air back to the IDEC unit. The cold air room and the hot air room may be located on opposite sides of the IT room to allow the internal airflow to flow from one side to the opposite side, traveling through the airspace of the electronic racks.

The data center system further includes a control system communicatively coupled to the cold air room, the hot air room, and/or the IT room, as well as the first set of temperature sensors. In response to sensor data received from the temperature sensors of the first set, the control system is configured to analyze the sensor data based on a first set of thermal management rules. The control system transmits one or more control signals to the IDEC unit to modify one or more operating parameters of the IDEC unit based on the analysis to provide an optimal thermal environment for operating the IT components of the electronic racks. For example, the control system may configure the IDEC to operate in one of the operating modes, such as, a dry air cooling mode, an evaporative cooling mode, and/or a DX (or air conditioning) mode.

The control system may further adjust one or more operating parameters in each of the operating modes such as fans speed, volume of mist of liquid drops, and/or condenser and evaporator settings. In one embodiment, the hot air room further includes a second set of temperature sensors to sense and measure the temperature of the hot air room. The control signals may be generated based on the sensor data of both the first set and the second set of temperature sensors. The IDEC may be controlled or adjusted based on the average temperatures measured by the temperature sensors or the temperature difference between the cold air room and the hot air room.

According to one embodiment, the data center further includes a set of pressure sensors disposed at least within the cold air room or between the interface between the cold air room and the IT room to sense and measure the air pressure of the cold air entering the IT room. Based on the temperature sensor data, the control system may adjust the opening ratio of the louvers (e.g., windows, doors) between the cold air room and the IT room to control the airflow volume entering the IT room, which in turn adjusts the temperature of the IT room. Similarly, a set of pressure sensors may also be disposed within the hot air room or on the interface between the IT room and the hot air room for similar purposes. Based on the temperature information and/or the air pressure information, the control system can control the IDEC unit to operate in different operating modes by adjusting the operating parameters of the IDEC unit, such that the IT room can operate in an optimized thermal environment.

According to another aspect of the invention, a data center system includes an IT room to contain a number of electronic racks. Each electronic rack can contain a number of server blades and each server blade can contain one or more IT components operating therein. The data center system further includes a cold air room near a first side of the IT room and a hot air room near a second side of the IT room. The cold air room is configured to receive cold air from an IDEC unit and to distribute the cold air to the electronic racks via one or more louvers of airflow windows disposed on a wall between the cold air room and the IT room, to exchange heat generated from IT components of the electronic racks. The hot air room is configured to receive hot or warmer air carrying the exchanged heat from the IT room and return the hot/warmer air back to the IDEC unit.

The data center system further includes a first set of one or more pressure sensors disposed near the cold air room or between the cold air room and the IT room (e.g., near the louvers) to sense and measure the air pressure of the internal airflow entering the IT room from the cold air room. The data center system further includes a control system coupled to the cold air room, the IT room, the hot air room, and the pressure sensors. In response to sensor data received from the pressure sensors, the control system is configured to analyze the sensor data based on a set of thermal management rules or algorithms and to adjust an opening ratio of at least one of the louvers interfacing the cold air room and the IT room based on the analysis to adjust a cold airflow volume entering the IT room through at least one of the louvers, which in turn adjusts the thermal conditions of the IT room.

According to one embodiment, a second set of one or more pressure sensors may be disposed near the hot air room or between the hot air room and the IT room (near the airflow opening on a wall between the IT and hot air rooms). The control system is to control the opening ratio of the louvers further based on the sensor data obtained from the second set of pressure sensors. The pressure sensor data of the second set may also be utilized to control the opening ratio of louvers disposed between the IT room and the hot air room. The opening ratios of the louvers may be adjusted based on the averaged air pressures measured by the pressure sensors or the pressure difference between the cold air room and the hot air room. The purpose of adjusting the louvers is to ensure uniform air flow rate delivery to the room from the walls.

According to a further aspect of the invention, an optimization process may be performed to determine an optimal setting of an IDEC unit for a data center system, such that the electronic racks can operate in an optimal thermal environment, and at the same time, using minimum cooling power. The optimization process is an iterative process using a set of thermal setting candidates of the IDEC. Initially, an optimal partial power usage effectiveness (PPUE) is configured as an initial PPUE value. An optimal set of parameters of an IDEC unit is set to an initial set of parameters. For each of the operating condition candidates of IDEC unit, the IDEC unit is configured based on a set of parameters associated with the current operating condition candidate. The pressure sensor data is collected from the pressure sensors disposed at various locations within a cold air room connected to an IT room having a number of electronic racks. Each electronic rack contains a number of IT components. The pressure sensors are configured to measure the air pressure of the cold air received from the IDEC unit (e.g., internal airflow). The cold air is to be distributed to the electronic racks to exchange heat generated from the IT components and transformed into hot/warmer air. The hot air is then received by the hot air room and returned back to the IDEC unit from the hot air room.

In addition, according to one embodiment, the temperature sensor data is collected from the temperature sensors disposed at various locations near the cold air room. A current thermal condition (e.g., temperature, air pressure) of the IT room is determined based on the pressure sensor data and temperature sensor data. It is then determined whether the current thermal condition satisfies a predetermined thermal condition associated with the IT room. A current PPUE of the data center system is calculated and compared with the optimal PPUE. If the current PPUE is lower than the optimal PPUE value, the optimal PPUE value is replaced by the current PPUE value. The set of parameters of the IDEC unit is designated as the optimal set of the parameters for the IDEC unit. After all of the operating condition candidates of the IDEC unit have been processed, the IDEC unit is then configured base on the optimal set of parameters, such that the IT room is to operate in an optimal thermal condition, for the current IT workload (heat load) condition.

FIG. 1 shows a perspective view of a data center system according to one embodiment. Referring to FIG. 1, data center system 100 includes an IT room 101, a cold air room 102, and a hot air room 103. IT room 101 includes a number of electronic racks such as electronic racks 111-112. Each electronic rack contains one or more IT components arranged in a stack. An IT component can be a computer server providing data services to clients. Alternatively an IT component can be a peripheral device or a network appliance device such as cloud storage systems. Each IT component may include one or more processors, memory, and/or a storage device that may generate heat during operations. The electronic racks are arranged in a number of rows of electronic racks, in this example, rows 104-105 of electronic racks. The rows of electronic racks are arranged spaced apart to form one or more cold aisles and one or more hot aisles. In this embodiment, although there are only two rows 104-105 of electronic racks shown, there can be more rows to be contained in IT room 101.

In one embodiment, each row of electronic racks is positioned or sandwiched between a cold aisle and a hot aisle. In this example, row 104 and row 105 are positioned apart from each other to form cold aisle 114A, hot aisle 115, and cold aisle 114B. Hot aisle 115 is formed between row 104 and row 105. Row 104 is positioned or sandwiched between cold aisle 114A and hot aisle 115, while row 105 is positioned or sandwiched between cold aisle 114B and hot aisle 115. In one embodiment, hot aisle 115 is contained or enclosed by hot aisle containment (or container or other enclosures). In another embodiment, the cold aisles are contained in a containment environment instead of the hot aisles. In a further embodiment, both hot aisles and cold aisles are contained in an enclosed environment. In one embodiment, the backend of the electronic racks of rows 104-105 are facing hot aisle 115, while the frontends of the electronic racks are facing cold aisle 114A or cold aisle 114B and away from hot aisle 115.

In one embodiment, cold air room 102 is located and adjacent to a first side of IT room 101, while hot air room 103 is located and adjacent to a second side of IT room 101. In this example, the first side and the second side are opposite sides of IT room 101. Cold air room 102 is configured to receive cold air or cool air via one or more inlet ports from a cold air source such as cold air source 180. The cold air is allowed to enter IT room 101 from cold air room 102 via one or more openings disposed on the wall between cold air room and IT room 101 (not shown). The cold air entering IT room 101 to form cold aisles 114A-114B.

Hot air room 103 is configured to exhaust the hot air from hot aisle 115 and return the hot air or warmer air back to the cold air source 180 for heat exchange. Note that cold air source 180 can include a heat exchanger or chiller. For example, cold air source 180 can be an IDEC system or device, which can operate in a number of different operating modes (e.g., air cooling mode, evaporative cooling mode, and DX cooling mode). Alternatively, cold air source 115 can simply be the natural ambient air outside of the data center system 100.

An evaporative cooler is a device that cools air through the evaporation of water. Evaporative cooling differs from typical air conditioning systems, which use vapor compression or absorption refrigeration cycles. Evaporative cooling works by exploiting water's large enthalpy of vaporization. The temperature of dry air can be dropped significantly through the phase transition of liquid water to water vapor (evaporation). Direct evaporative cooling is used to lower the temperature and increase the humidity of air by using latent heat of evaporation, changing liquid water to water vapor. In this process, the energy in the air does not change. Warm dry air is changed to cool moist air. The heat of the outside air is used to evaporate water. Indirect evaporative cooling is a cooling process that uses direct evaporative cooling in addition to some type of heat exchanger to transfer the cool energy to the supply air. The cooled moist air from the direct evaporative cooling process never comes in direct contact with the conditioned supply air.

Referring back to FIG. 1, in this example, the cold air is received from one or more inlets or inlet ports disposed on a wall of cold air room 102, where the wall is substantially parallel with a third side of IT room 101. The third side of IT room 101 is substantially perpendicular to the first side and the second side, while the first side and the second side are substantially parallel to each other. Similarly, the hot air is exhausted from hot air room 103 to the external environment or back to cold air source 180 via one or more outlets or outlet ports disposed on a wall of hot air room 102, where the wall is substantially parallel with the third side of IT room 101.

According to one embodiment, hot aisle 115 is enclosed or contained within hot aisle containment 120, such that the hot air cannot escape or spill from hot aisle 115 into other areas of IT room 101 such as cold aisles 114A-114B. Instead, the hot aisle enters hot air room 103 from hot aisle via one or more openings (e.g., windows, doors) disposed on a wall between hot aisle 115 and hot air room 103. In one embodiment, the openings allow an operator or a user to enter hot aisle 115 from hot air room 103 to access the backend of the electronic racks, for example for maintenance services. Doors are needed on the 102 and 103, for operators to be able to enter cold air room 102 and hot air room 103. And no door is needed on hot aisle 115, and doors are needed on the walls between cold air room 102 and IT room 101, according to some embodiments. Similarly, the openings disposed on the wall between cold air room 102 and IT room 101 may include one or more doors to allow an operator or user to enter cold aisles 114A-114B from cold air room 102. As a result, entering or leaving cold aisles or hot aisles would not have a significant impact on the cold air distribution and hot air exhaustion. That is, entering or leaving hot aisle 115 would not alter cold air distribution for cold aisles 114A-114B, because hot aisle 115 is separated from cold aisles 114A-114B and the rest of IT room 101 by hot aisle containment 120. Similarly, entering or leaving cold aisles 114A-114B would not affect hot air exhaustion of hot aisle 115, since opening a door for a user to enter or leave would not mix the cold air and the hot air.

Figure 2A:
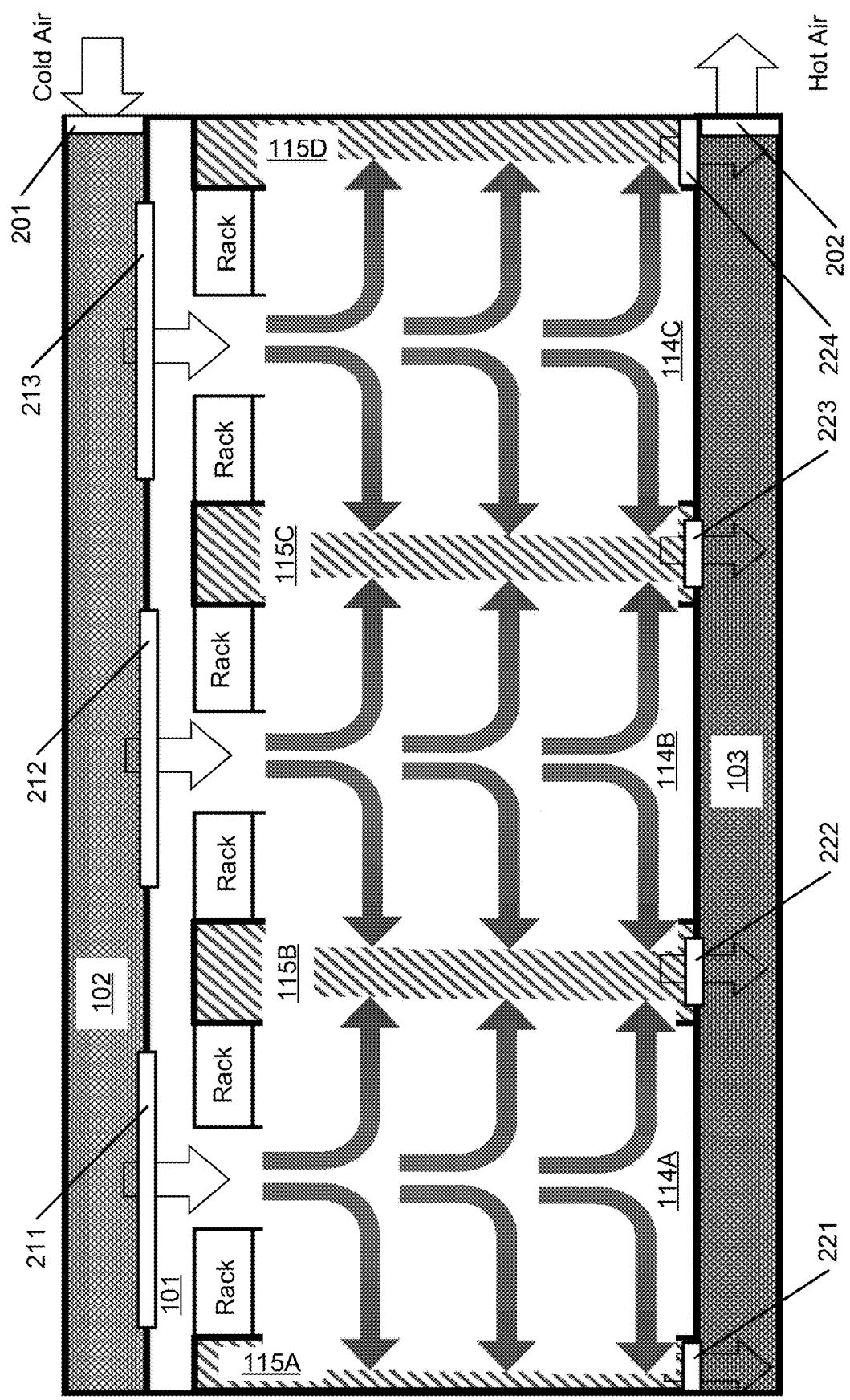
FIGS. 2A-2B shows a top view of a data center system according to certain embodiments.

FIG. 2A shows a top view of a data center system according to one embodiment. The data center system can represent a top view of data center 100 of FIG. 1. Referring to FIG. 2A, the electronic racks are arranged into a number of rows similar to rows 104-105 of FIG. 1. The rows of electronic racks are positioned and spaced apart from each other to form cold aisles 114A-114C (collectively referred to as cold aisles 114) and hot aisles 115A-115D (collectively referred to as hot aisles). Hot aisles 115A-115D are each enclosed or contained in a hot aisle containment structure. Cold air room 102 is positioned adjacent to a first side of IT room 101. Hot air room 103 is positioned adjacent to a second side of IT room 101.

In this example, the first side and the second side of the IT room 101 are opposite sides. The cold air is received from an external cold air source such as an IDEC system via one or more inlet or intake ports 201 into cold air room 102. The cold air then enters IT room 101 via one or more openings (e.g., windows, doors with louvers) 211-213 and enter cold aisles 114A-114C. The cold air then enters from the frontends of the electronic racks, travels through the airspace of the electronic racks, and enters hot aisles 115A-115D. As described above, hot aisles 115 are configured as an enclosed or contained environment that can receive the air flows from cold aisles through the airspace of the electronic racks. The hot air is prevented from spilling into other areas of IT room 101. The hot air can only exit IT room 101 and enter into hot air room 103 via openings 221-224.

In one embodiment, at least one of the openings 211-213 disposed on a wall between cold air room 102 and IT room 102 includes a door to allow an operator or user to enter IT room 101 and cold aisles to access the electronic racks such as frontends of the electronic racks for maintenance services. Similarly, each of openings 221-224 (no doors) allows an operator or user to enter the corresponding hot aisle to access the backend of the electronic racks adjacent to the hot aisle.

Figure 2B:
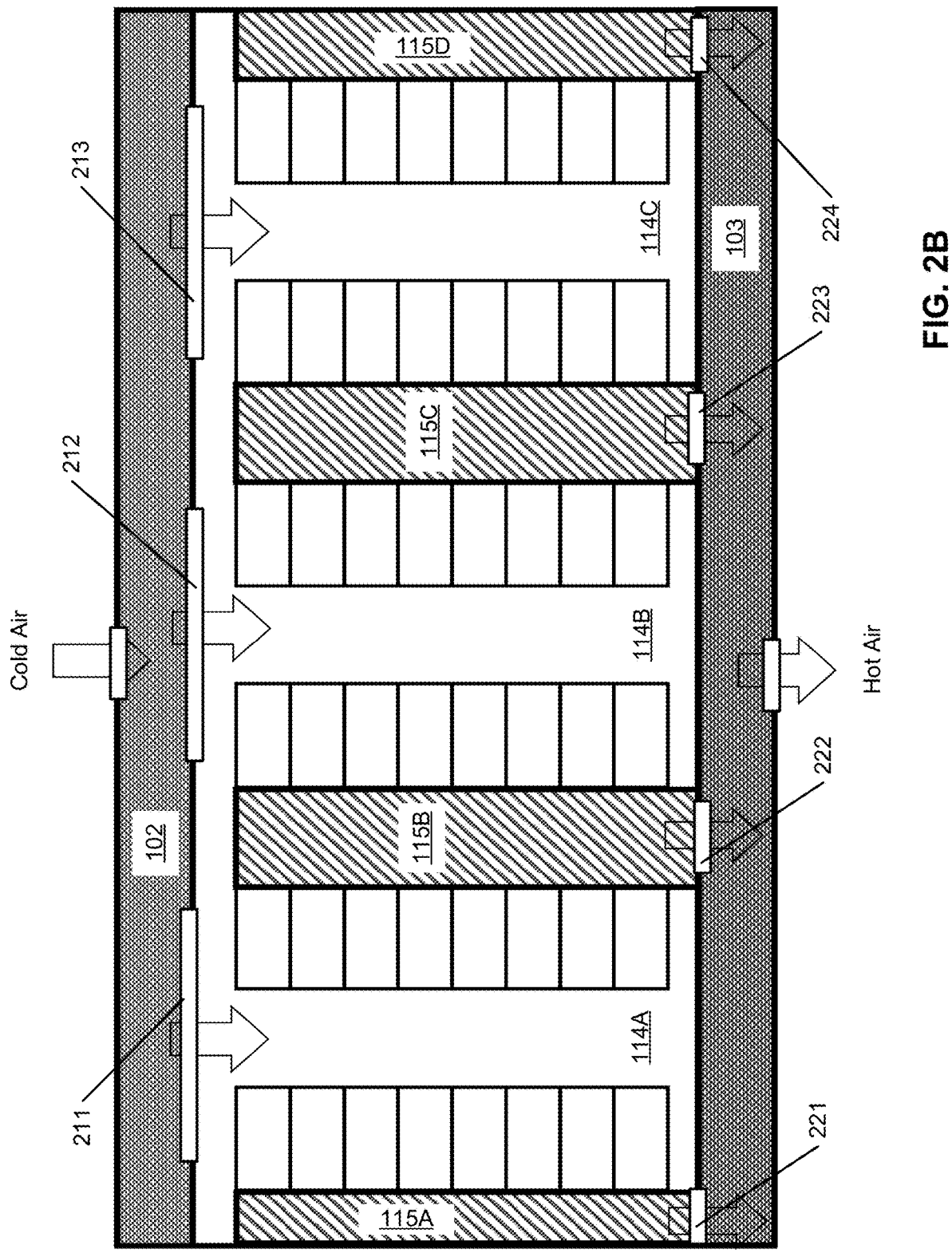

In this embodiment, the cold air enters into cold air room 102 via inlet 201 from the third side (e.g., the right hand side) of IT room 101. The hot air leaves hot air room via outlet 202 of IT room 101 from the third side. The third side is different from the first side adjacent to cold air room 102 and the second side adjacent to hot air room 103. In one embodiment, the first side and the second side are substantially parallel to each other. The third side is substantially perpendicular to the first side and/or the second side. Alternatively, according to another embodiment as shown in FIG. 2B, the cold air enters cold air room 102 from a side parallel to the first side. The hot air leaves hot air room 103 from a side parallel to the second side.

In the configurations as shown in FIGS. 2A-2B, the cold air is directly injected into cold air room 102 from external ambient environment with filtering. The hot air is exhausted from hot air room 103 back to the external environment. According to another embodiment, cold air room 102 and hot air room 103 are coupled to a cooling system such as an IDEC unit for heat exchange via respective airflow channels coupling the IDEC unit with the cold air room 102 and hot air room 103. The external cooling system may be configured as a modular system that can be coupled to cold air room 102 and hot air room 103, where the cooling system may be provided by a third party entity that is different than an entity providing or maintaining the data center system. Similarly, cold air room 102 and/or hot air room 103 may be configured as a modular module, which can be provided by a third party entity. Cold air room 102, hot air room 103, and/or cooling system 401 may be provided by the same or different vendors or organizations.

Figure 3:
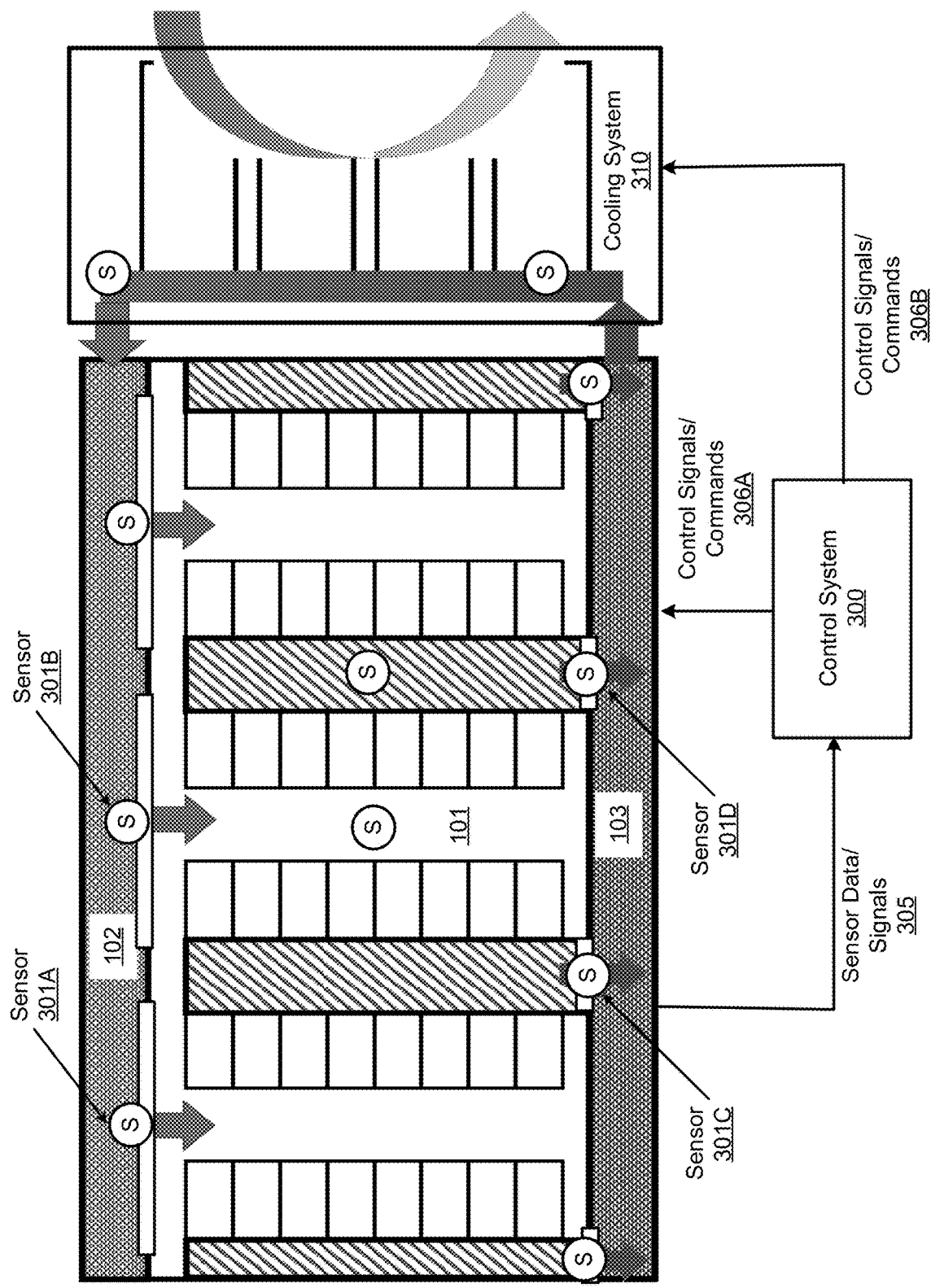
FIG. 3 shows a top view of a data center system according to another embodiment.

FIG. 3 is a block diagram illustrating a top view of a data center system according to one embodiment. Referring to FIG. 3, the configuration of IT room 101, cold air room 102, and hot air room 103 is similar to the one as shown in FIG. 2A. In addition, an IDEC unit 310 is coupled to cold air room 102 and hot air room 103, where IDEC unit 310 may represent the cooling system 180 of FIG. 1. In this embodiment, IDEC unit 310 provides cold air to cold air room 102 via a cold air channel and receives hot air from hot air room 103 via a hot air channel, forming an internal airflow that is circulated through cold air room 102, IT room 101, and hot air room 103.

Figure 4:
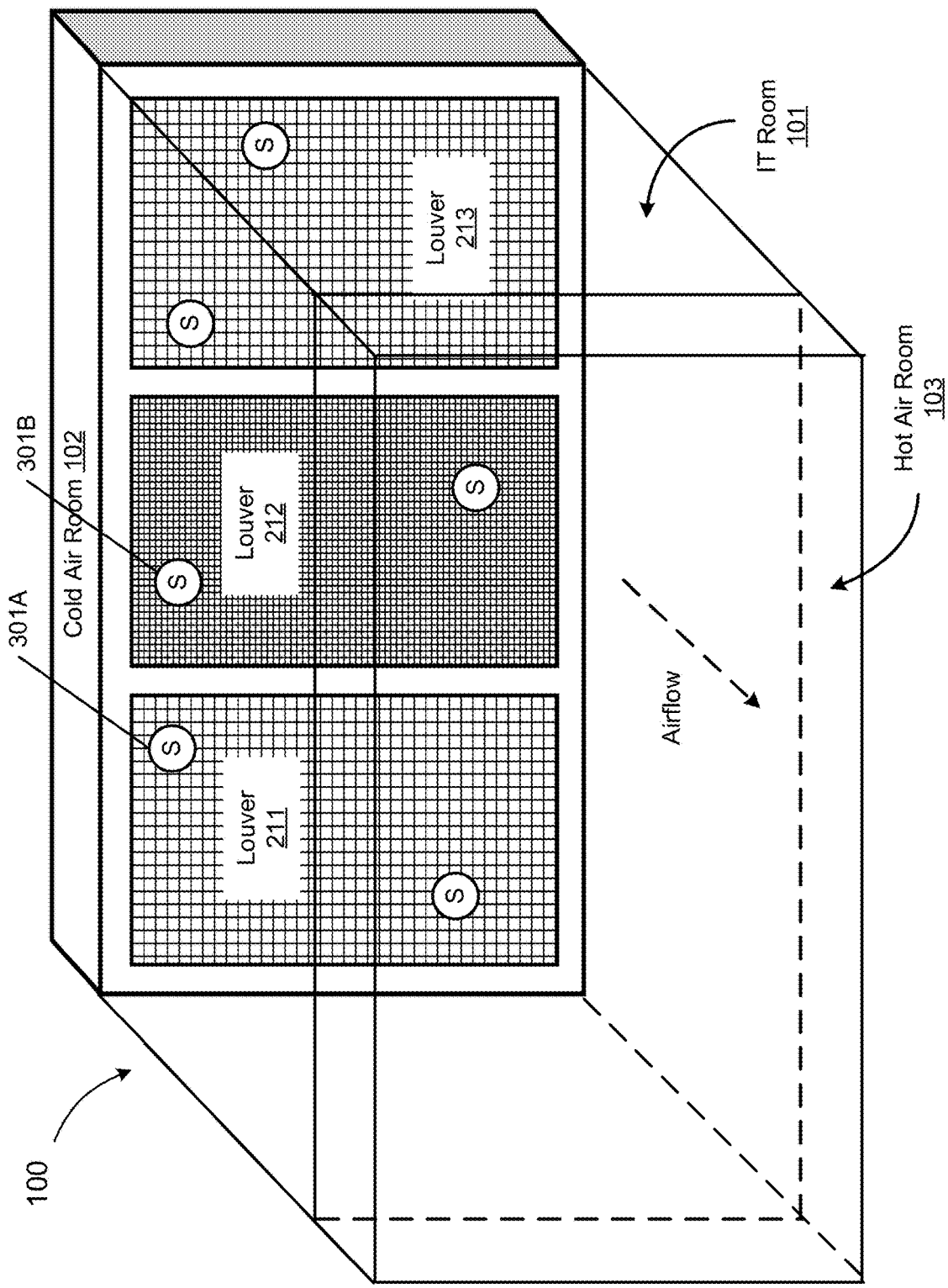
FIG. 4 shows an example of a data center room configuration according to one embodiment.

In addition, according to one embodiment, a number of sensors such as sensors 301A-301D (collectively referred to as sensors 301) may be disposed at various locations. Sensors 301 may include temperature sensors and/or pressure sensors. The temperature sensors are configured to monitor and measure the temperatures of the airflow, while the pressure sensors are configured to monitor and measure the air pressure of the internal air flow. In this embodiment, a first set of sensors such as sensors 301A-301B are disposed on a wall between cold air room 102 and IT room 101. For example, the sensors may be disposed on the opening such as airflow windows or doors. In one embodiment, the sensors may be disposed on the louvers mounted on the wall between cold air room 102 and IT room 101, as shown in FIG. 4. Similarly a second set of sensors such as sensors 301C and 301D may be disposed on the wall or louvers between IT room 101 and hot air room 103.

Furthermore, a control system 300 is communicatively coupled to IT room 101, cold air room 102, hot air room 103, sensors 301, and IDEC unit 310. According to one embodiment, control system 300 receives sensor data or signals 305 from sensors 301 and performs an analysis on the sensor data to determine the current thermal environment or condition of the data center. Based on the analysis, control system 300 transmits one or more control commands or signals 306A-306B (collectively referred to as control signals or commands 306) to control or adjust certain operating parameters or settings of the data center unit (e.g., IT room 101, cold air room 102, and hot air room 103) and IDEC 310. The control system 300 is to maintain proper and stable thermal conditions in the cold air room 102 and hot air room 103. A stable thermal environment of cold air room 102 and hot air room 103 ensures a stable thermal environment in the IT room 101. In addition, another goal is to improve energy efficiency of the IDEC system 310 by optimizing the operating conditions of IDEC system 310.

Figure 5:
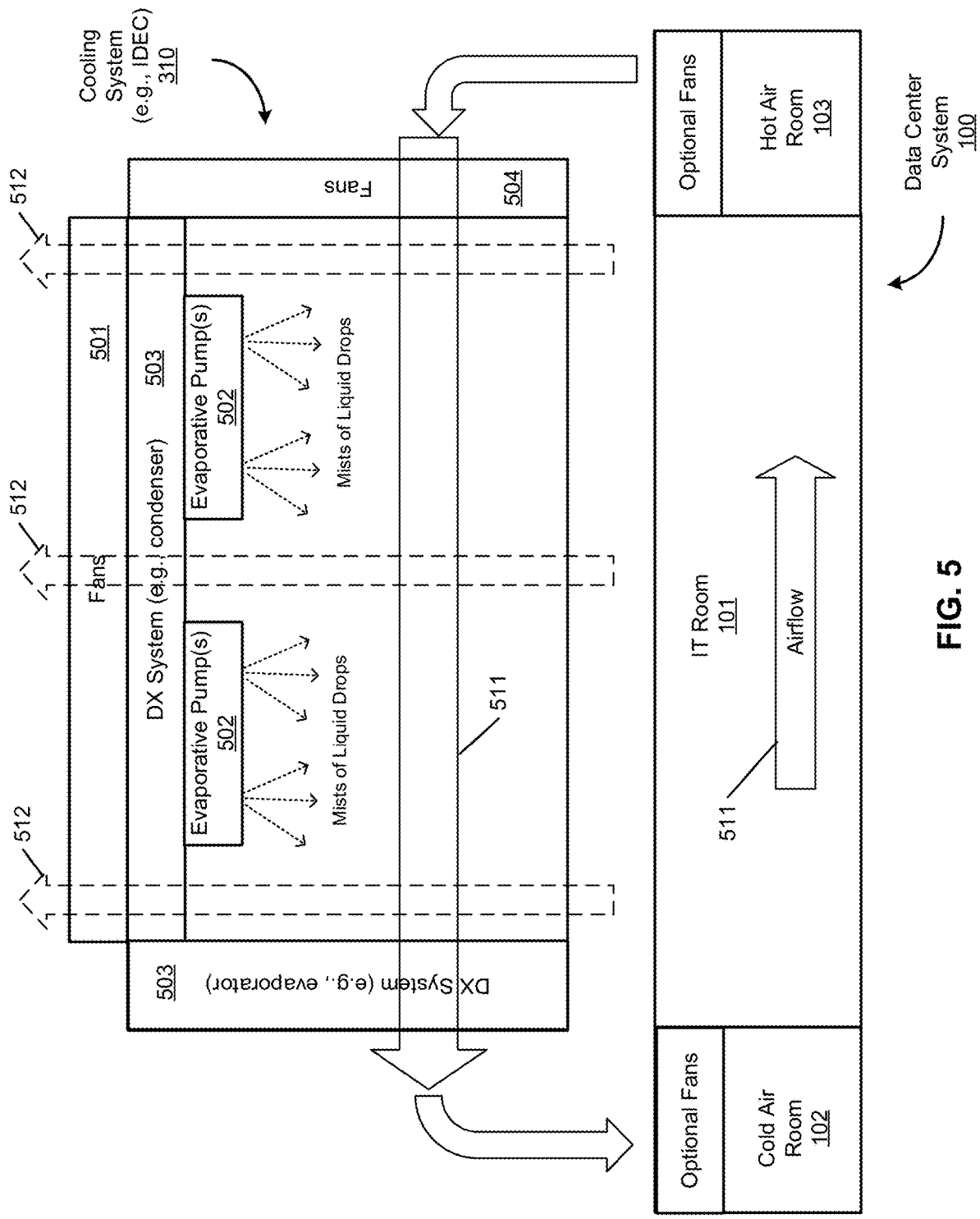
FIG. 5 shows an example of a data center configuration according to another embodiment.

FIG. 5 is a block diagram illustrating an example of an IDEC system according to one embodiment. Referring to FIG. 5, a typical IDEC unit can operate in a number of operating modes, including 1) an air cooling mode; 2) an evaporative cooling mode; and 3) a DX mode similar to air conditioning. Any one or more of these operating modes can be activated or deactivated individually and/or simultaneously. When IDEC 300 operates in an air cooling mode, one or more external fans 501 are utilized to circulate and exhaust external airflow 512 out, while one or more internal fans 504 circulates the internal air flow 511 across the chamber of IDEC 300 without directly contacting external airflow 512 for heat exchange. The fans speed of fans 501 and 504 can be controlled and adjusted by control system 300. When IDEC 310 operates in an evaporative cooling mode, one or more evaporative pumps 502 are utilized to pump and spray mist of liquid drops onto the external airflow 512 to reduce the temperature of the external airflow 512, which the heat carried by external airflow 512 may cause the mist of liquid drops to evaporate, which in turn lowers the temperature of the external airflow. When IDEC unit 310 operates in a DX mode, the DX system 503 is invoked to reduce the temperature of external airflow 512 and/or internal airflow 511. The control system 300 can turn on or turn off any one or more of the cooling modes based on the sensor data received from various temperature sensors and/or pressure sensors according to a set of thermal management rules or algorithms.

Figure 6:
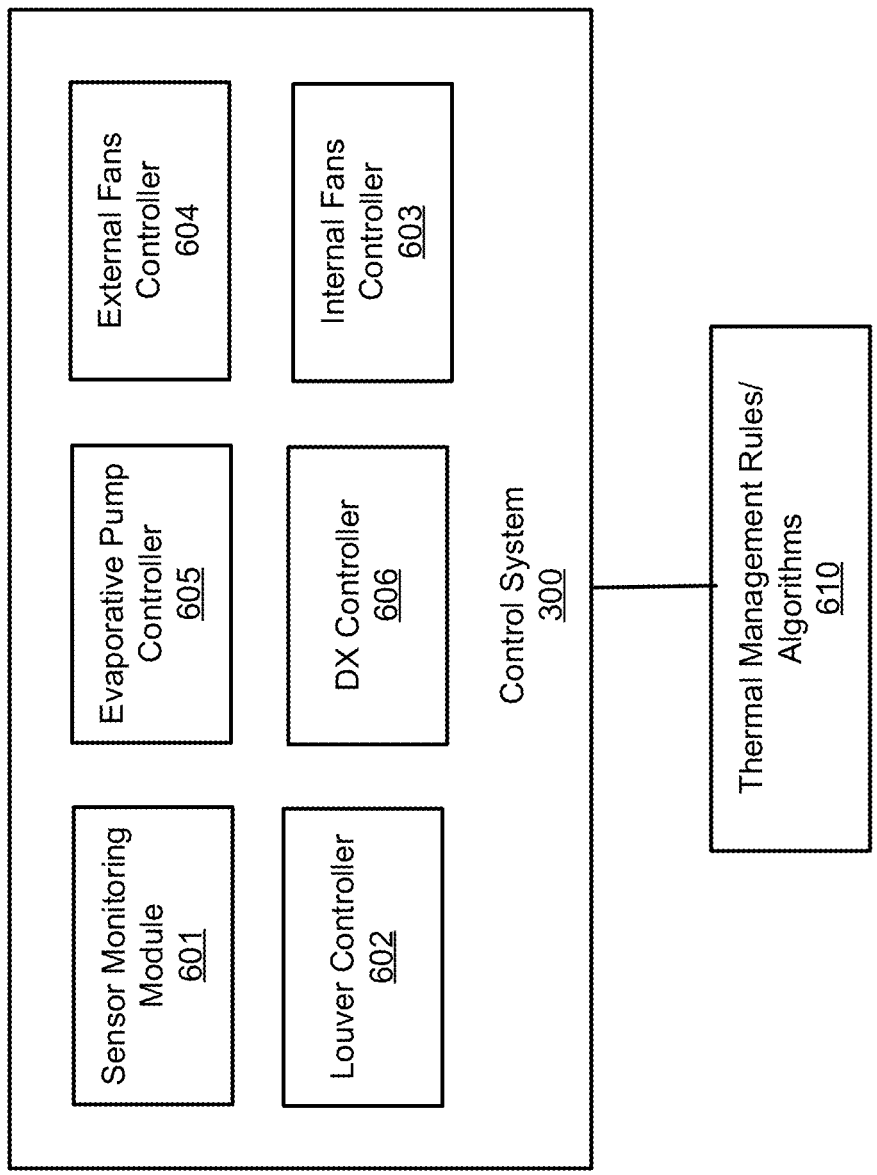
FIG. 6 is a block diagram illustrating an example of a control system according to one embodiment.

FIG. 6 is a block diagram illustrating an example of a control system according to one embodiment. Referring to FIG. 6, control system 300 includes, but is not limited to, analysis module 601, louver controller 602, internal fans controller 603, external fans controller 604, evaporative pump controller 605, and DX controller 606. Modules 601-606 may be implemented in software, hardware, or a combination thereof. For example, modules 601-606 may be loaded into a memory and executed by one or more processors to perform various operations. Note that some or all of modules 601-606 may be integrated into fewer modules or a single module.

Analysis module 601 is configured to monitor and receive sensor data from most or all of the sensors of the data center system, and to perform an analysis on the sensor data to determine the current thermal conditions or environment of the data center. Analysis module 601 may perform the analysis based on a set of one or more thermal management rules or algorithms 610 to determine a set of one or more actions to configure and mange IDEC unit 310, for example, by invoking specific modules 602-606.

Louver controller 602 is configured to control the louvers (e.g., intake louvers) between the cold air room 102 and IT room such as louvers 211-213, as well as the louvers (e.g., exhaust louvers) disposed between IT room 101 and hot air room 103 if there is any. A louver can be controlled by louver controller 602 to be more opened, closed, or different opening angles, etc. By adjusting the opening and/or angle of a louver, the volume of the airflow flowing through the louver can be controlled. In one embodiment, based on the analysis, analysis module 601 determines a set of one or more controlling parameters and invokes louver controller 602 to adjust an opening ratio of a particular louver.

Referring back to FIG. 4, there are various pressure sensors disposed on different locations of different louvers 211-213. Depend upon the direction of the internal airflow, the air pressures on different louvers may be different, which may represent different volumes of the airflow flowing through the corresponding louvers. For example, if the air pressure detected by pressure sensor 301A is higher than the air pressure detected by pressure sensor 301B, it may indicate that the airflow volume flowing through louver 211 is higher than the airflow volume flowing through louver 212. As a result, the opening ratio of louver 211 may need to be adjusted lower (e.g., to be closed) to allow less air flowing through louver 211, and more air flowing through louver 212. The goal of managing louvers 211-213 is to provide relatively even airflow volumes flowing through all louvers.

According to one embodiment, analysis module 601 receives the pressure sensor data from most or all pressure sensors disposed on louvers 211-213 and determines the air pressures measured by the pressure sensors. Analysis module 601 calculates an average air pressure ($P_{ave}$) based on the measured air pressures as follows:

$$P_{ave} = \frac{1}{n}\sum_{1}^{n} P_n$$

where $P_n$ represents an individual air pressure measured by a particular one of the pressure sensors. The opening ratio of the corresponding louver can be adjusted based on the difference between the individually measured air pressure and the average air pressure:

$$\Delta P = P_n - P_{ave}$$

In the cases that the static air pressure within the cold air room is in difference, the corresponding louvers will be controlled to either increase the opening ratio (low pressure) or decrease the opening ratio (high pressure). Thus, if the pressure difference $\Delta P$ is positive, it means the local air pressure is relatively high compared to the average air pressure and the corresponding louver needs to be opened less to reduce the air pressure.

An opening ratio of a louver refers to the opening angle percentage of the louver. An opening ratio of 0 means the louver is fully closed, in which an airflow moving path is fully blocked. An opening ratio of 100% means the louver is fully open, in which the airflow can pass through the louver with the minimum flow resistance. A louver can be considered as an airflow valve, similar as liquid fluid valve opening ratio.

The $\Delta P$ is calculated to capture how much is the difference among each individual $P_n$, by comparing to the Pa. In addition, a predetermined tolerance range for difference (e.g., +/−0.01 pounds per square inch or PSI) is utilized. If the $\Delta P$ is within the acceptable range (e.g., +/−0.01 PSI), there is no need to take any action. If $\Delta P$>+range (e.g., 0.01 PSI), this means the corresponding local location static pressure is high. This means the louver needs to introduce more resistance by reducing the opening ratio to make the value lower. This means less air flow flowing through. Similarly, if $\Delta P$<−range (e.g., −0.01 PSI), the opening ratio needs to be increased.

For example, there a total of five sensors, data collected are 1.2, 1.3, 1.5, 1.2, and 1.3 PSI. Then the averaged value $P_{ave}$ is 1.3. If +/−0.1 is the acceptable range, then the value 1.5 is out of the acceptable range. The other four are within the range. Then $\Delta P$=1.5−1.3>0.1 (acceptable range), the louver open ratio should be decreased. When louver is decreased, more resistance is introduced, the pressure drop becomes larger, then the static pressure reading value will be decreased as a result.

In one embodiment, if there are multiple pressure sensors disposed on a particular louver, the air pressure of that particular louver may be calculated based on the average of the pressure readings from the pressure sensors associated with the louvers.

In one embodiment, if there are multiple pressure sensors disposed on both the supply and return sides of each louver, the air pressure drop across each louver may be calculated and used for controlling the louver opening ratio, similar principle as using the static pressure.

Figure 7:
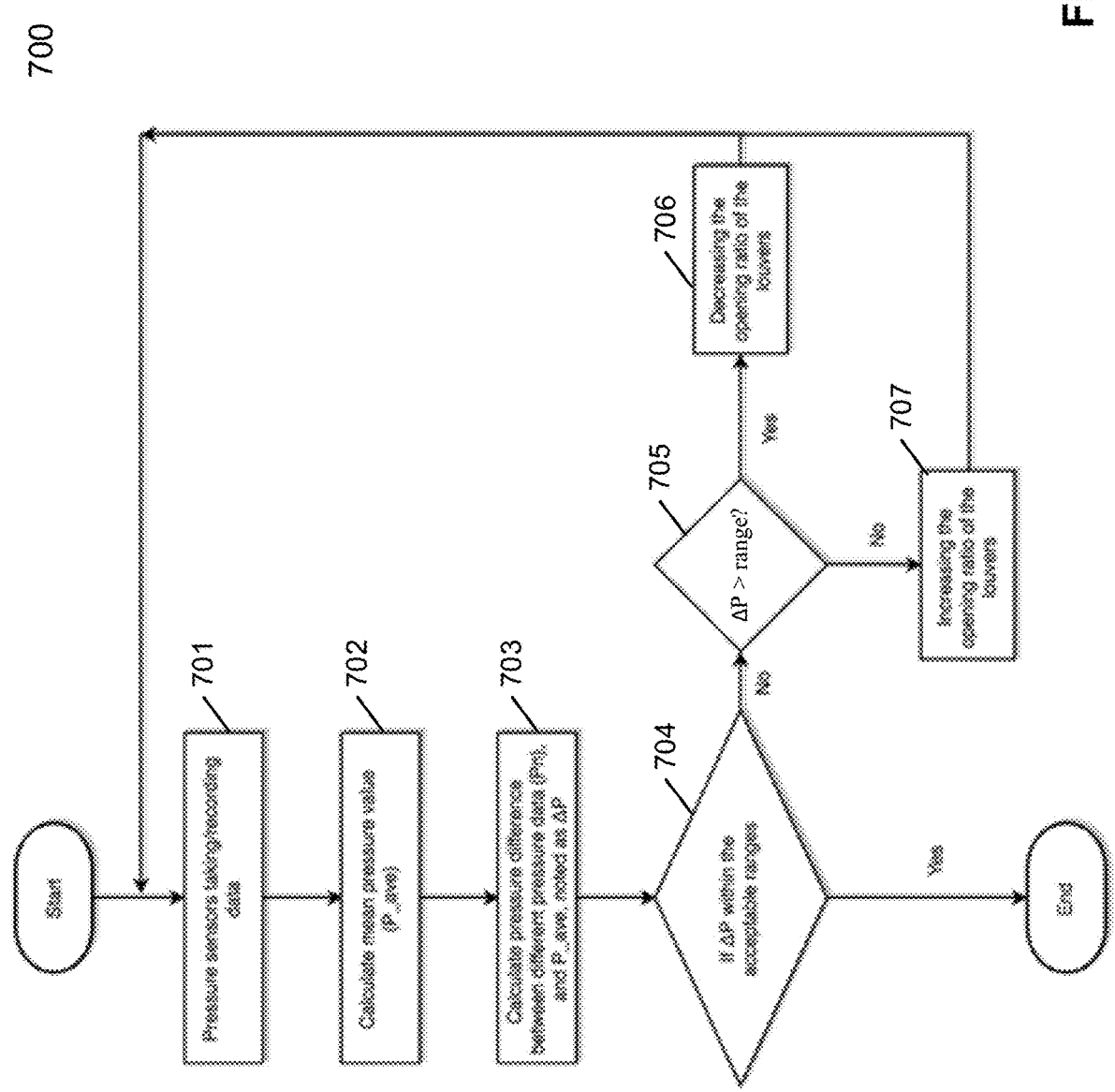
FIG. 7 is a flow diagram illustrating a thermal management process of a data center system according to one embodiment.

FIG. 7 is a flow diagram illustrating a process of controlling louvers based on sensor data according to one embodiment. Process 700 may be performed by processing logic which may include software, hardware, or a combination thereof. For example, process 700 may be performed by control system 300. Referring to FIG. 7, in operation 701, one or more pressure sensors are utilized to monitor and measure air pressures of the louvers. In operation 702, an average air pressure Pa is calculated based on the pressure readings form the pressure sensors. For each of the louvers, in operation 703, a pressure difference ΔP between the air pressure of the louver $P_n$ and the average pressure Pa, is calculated, i.e., $\Delta P = P_n - P_{ave}$.

In operation 704, it is determined whether the pressure difference ΔP is within a predetermined range (e.g., an acceptable range such as +/−0.01 PSI). If so, it means the air pressure of the louver is normal. Otherwise, if the pressure difference ΔP is outside of the predetermined range, in operation 705, it is determined whether the pressure difference ΔP is greater than either the upper limit of the range or less than the lower limit of the range (e.g., −0.01). If ΔP is greater than the upper limit of the range, in operation 706, the opening ratio of the louver is decreased. If ΔP is lower than the lower limit of the range (e.g., −0.01), the opening ratio of the louver is increased in operation 707. Note that process 700 may be performed further in view of temperature sensor data obtained from the temperature sensors disposed in the cold air room, the hot air room, and/or the IT room. That is, the louvers may be controlled and adjusted further based on the temperature sensor data representing the temperature of the cold air room and/or hot air room.

According to another aspect of the invention, the pressure sensor data can also be utilized to control the fans speed of the internal fans such as fans 504 of FIG. 5. For example, the air pressure of the internal airflow is proportionally related to the temperature in the IT room 101. By measuring the air pressure of the internal airflow, the temperature of the IT room can be derived. Thus, based on the air pressure of the internal airflow, the speed of the internal fans 504 can be adjust, which in turn adjust the thermal condition of the IT room 101.

Figure 8:
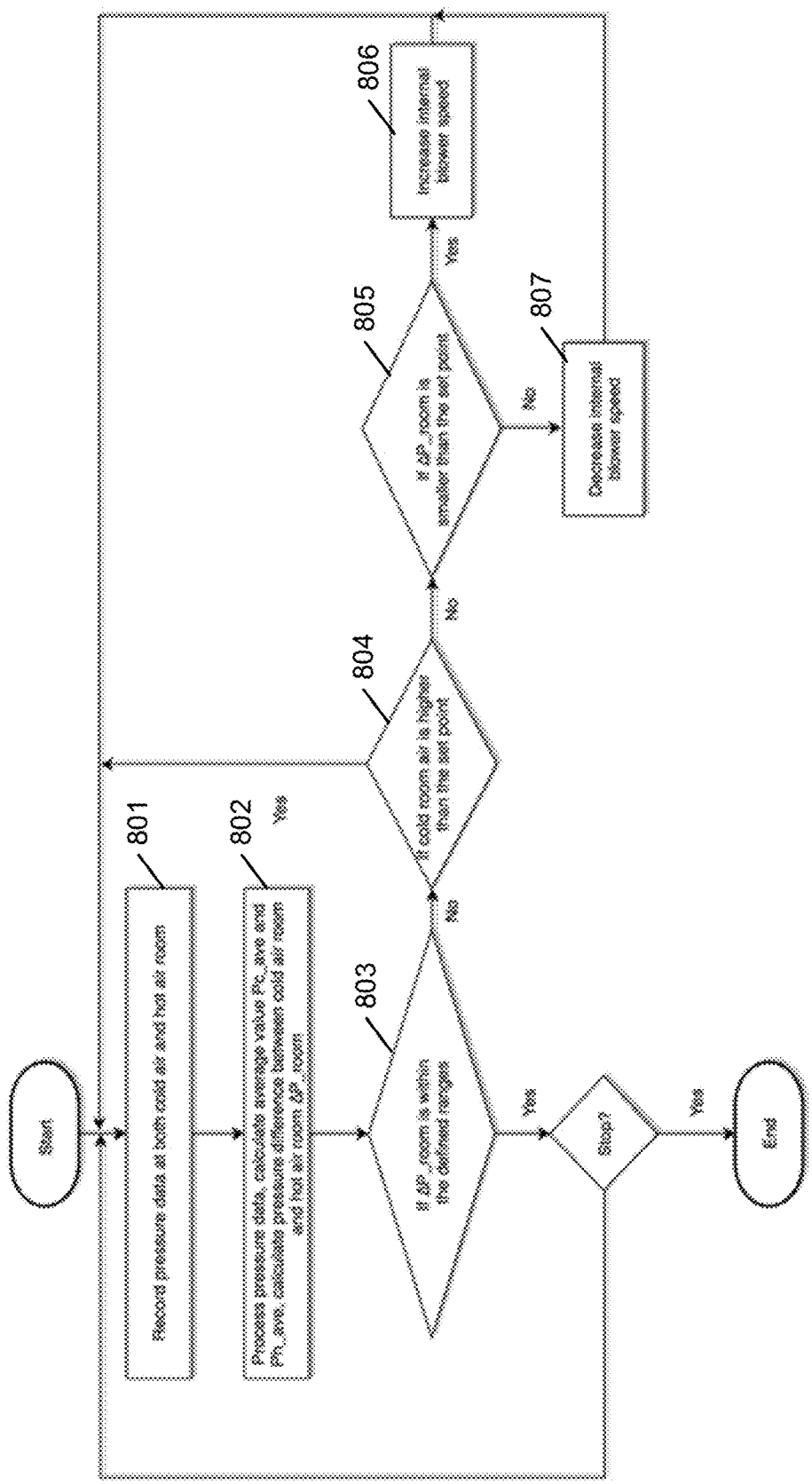
FIG. 8 is a flow diagram illustrating a thermal management process of a data center system according to another embodiment.

FIG. 8 is a flow diagram illustrating a process of controlling an internal airflow according to one embodiment. Process 800 may be performed by processing logic which may include software, hardware, or a combination thereof. For example, process 800 may be performed by control system 300. Referring to FIG. 8, in operation 801, pressure sensor data is collected from the pressure sensors disposed in the cold air room 102 and hot air room 103. In operation 802, the air pressure of the cold air room and the air pressure of the hot air room are determined, and the difference between the cold air room air pressure and the hot air room air pressure is calculated. In operation 803, it is determined whether the pressure difference is within a predetermined range. If the pressure difference is not within the predetermined range, in operation 804, it is determined whether the air pressure of the cold air room is higher than a first predetermined set point. If the air pressure of the cold air room is below the first predetermined set point, in operation 805, it is determined whether the pressure difference between the cold air room and the hot air room is below a second predetermined set point (e.g., upper limit or lower limit of the range). If so (e.g., below a lower limit of the range), in operation 806, the internal fans speed is increased; otherwise (e.g., above an upper limit of the range), the internal fans speed is decreased in operation 807. The first and second predetermined set points may the same or different. Note that process 800 may be performed further in view of temperature sensor data obtained from the temperature sensors disposed in the cold air room, the hot air room, and/or the IT room. That is, the internal fans may be controlled and adjusted further based on the temperature of the cold air room and/or hot air room.

According to a further aspect, supply air temperature data at the cold air room 102 are recorded and used as a part of the control signals of IDEC operating conditions and modes. The cold air room temperatures can be considered as the cold aisle temperatures, as well as the supply air inlet temperatures of the servers. This control includes the IDEC external blower such as fans or blowers 501, different operating modes including dry-blub operating, wet-bulb operating and DX cooling mode. Normally, the data center supply air temperature is predefined. There are also industry guidelines for setting data center cold aisle air temperature, such as ASHRAE (American Society of Heating, Refrigerating, and Air-Conditioning Engineers) thermal guidelines for data centers. $T_{max}$ is the maximum temperature value collected. The required ranges are the acceptable temperature ranges for allowing the cold air room temperature to stay at. Since there are multiple operating modes can be adjusted on IDEC 300 to adjust cooling capacity, including changing IDEC external blower speed, evaporative pump speed, and DX operating mode. Such actions can be selectively performed or in parallel in response to the sensor data collected from the temperature sensors.

Referring back to FIG. 6, according to one embodiment, in response to temperature sensor data received from the temperature sensors, analysis module 601 is configured to analyze the temperature sensor data and to invoke external fans controller 604 to adjust the fans speed of fans or blowers 501 to control the volume or speed of external airflow 512.

Figure 9:
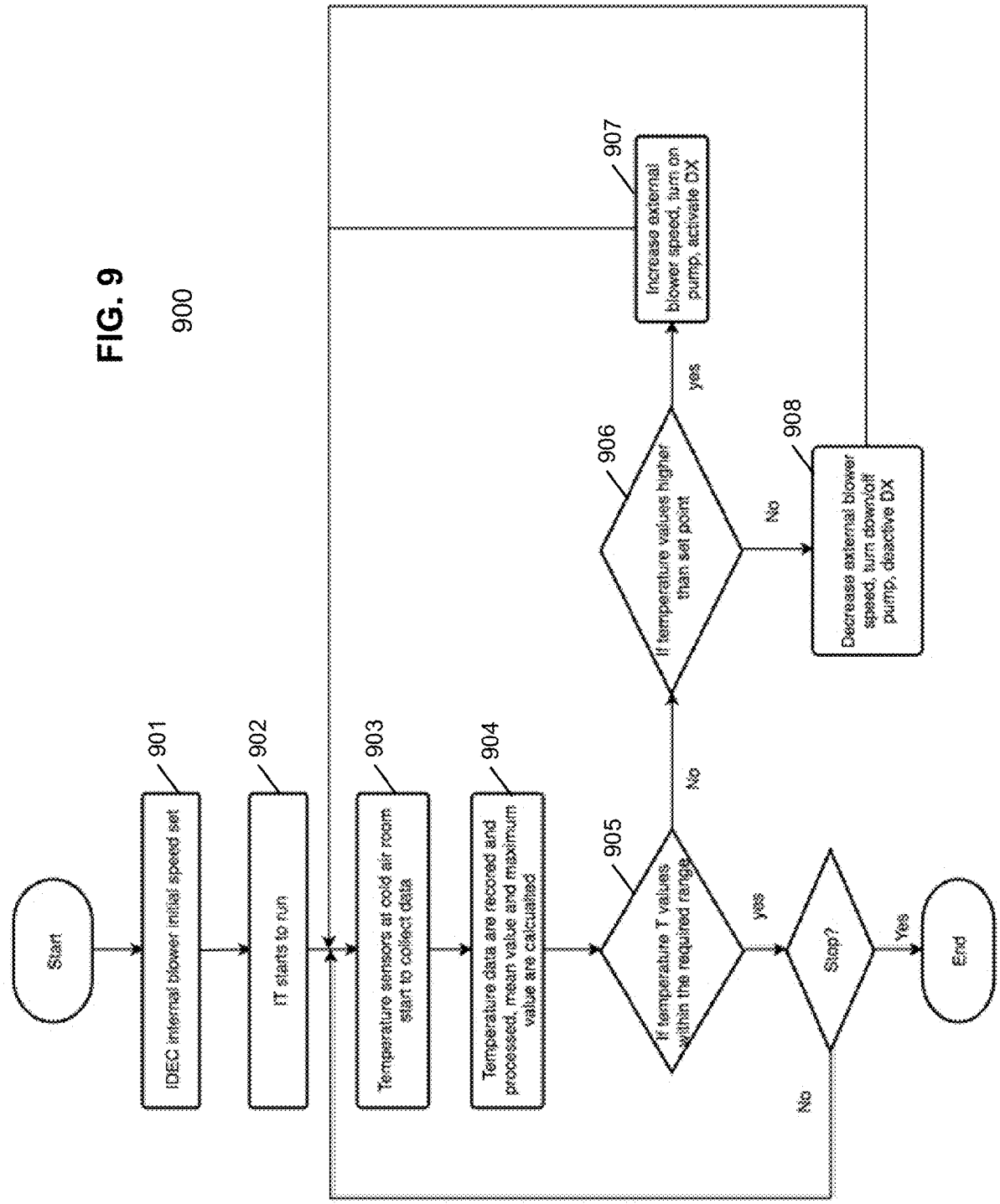
FIG. 9 is a flow diagram illustrating a thermal management process of a data center system according to another embodiment.

FIG. 9 is a flow diagram illustrating a process of controlling fans for an external airflow based on temperature sensor data according to one embodiment. Process 900 may be performed by processing logic which may include software, hardware, or a combination thereof. For example, process 800 may be performed by control system 300. Referring to FIG. 9, in operation 901, the internal fans of an IDEC unit is set to an initial speed and the server blades of the IT rooms start to operate in operation 902. In operation 903, the temperature of the cold air room is determined based on temperature sensor data obtained from the temperature sensors disposed near or within the cold air room. In operation 904, the temperature sensor data is analyzed, including calculating the average temperature of the temperature sensors, etc. In operation 905, it is determined whether the temperature (e.g., the average temperature) of the cold air room is within a predetermined range. If the temperature is outside of the predetermined range, in operation 906, it is determined whether the temperature is higher than a predetermined set point (e.g., an upper limit of the range). If so, in operation 907, the external fans speed is increased. In addition, the evaporative pumps 502 and/or DX system 503 may be activated. Otherwise if the temperature is lower than a predetermined set point (e.g., a lower limit of the range), in operation 908, the external fans speed may be decreased, and the evaporative pumps 502 and/or DX system 503 may be deactivated.

As described above, an IDEC unit can operate in a number of operating modes, including an air cooling mode, an evaporative cooling mode, and a DX mode. Each of these operating modes can be individually activated or deactivated, in sequence or in parallel as shown in FIG. 10. In addition, the specific operating parameters such as fans speed, mist liquid drop volume, and the settings of the condenser and evaporator of the DX system may also be individually configured. According to another aspect, the operating modes and operating parameters of these subsystems of an IDEC unit can be configured to find an optimal thermal environment or condition specifically tailored to a particular data center system given the specific configuration of the data center system, such as workload and layout. Note that process 900 may be performed further in view of pressure sensor data obtained from the pressure sensors disposed in the cold air room, the hot air room, and/or the IT room.

Referring back to FIG. 6, analysis module 601 can perform an iterative process to find a set of operating parameters or operating modes for the IDEC unit 310 that provides an optimal thermal operating environment for the IT room 101. For example, during the iteratively process, in response sensor data received from the sensors, analysis module 601 performs an analysis on the sensor data to determine the current thermal condition of the IT room 101. Analysis module 601 then invoke internal fans controller 603, external fans controller 604, evaporative pump controller 605, and DX controller 606 to control and adjust the respective operating parameters of the air cooling subsystem, the evaporative cooling subsystem, and the DX subsystem of IDEC unit 310. Such an optimization process is iteratively performed until all of the combinations of the operating modes and parameters have been processed. One of the combination settings of the subsystems is then selected that can satisfy the required thermal condition (e.g., lowest temperature) to IT room, and at the same time, minimize the water and electrical consumption.

Figure 11:
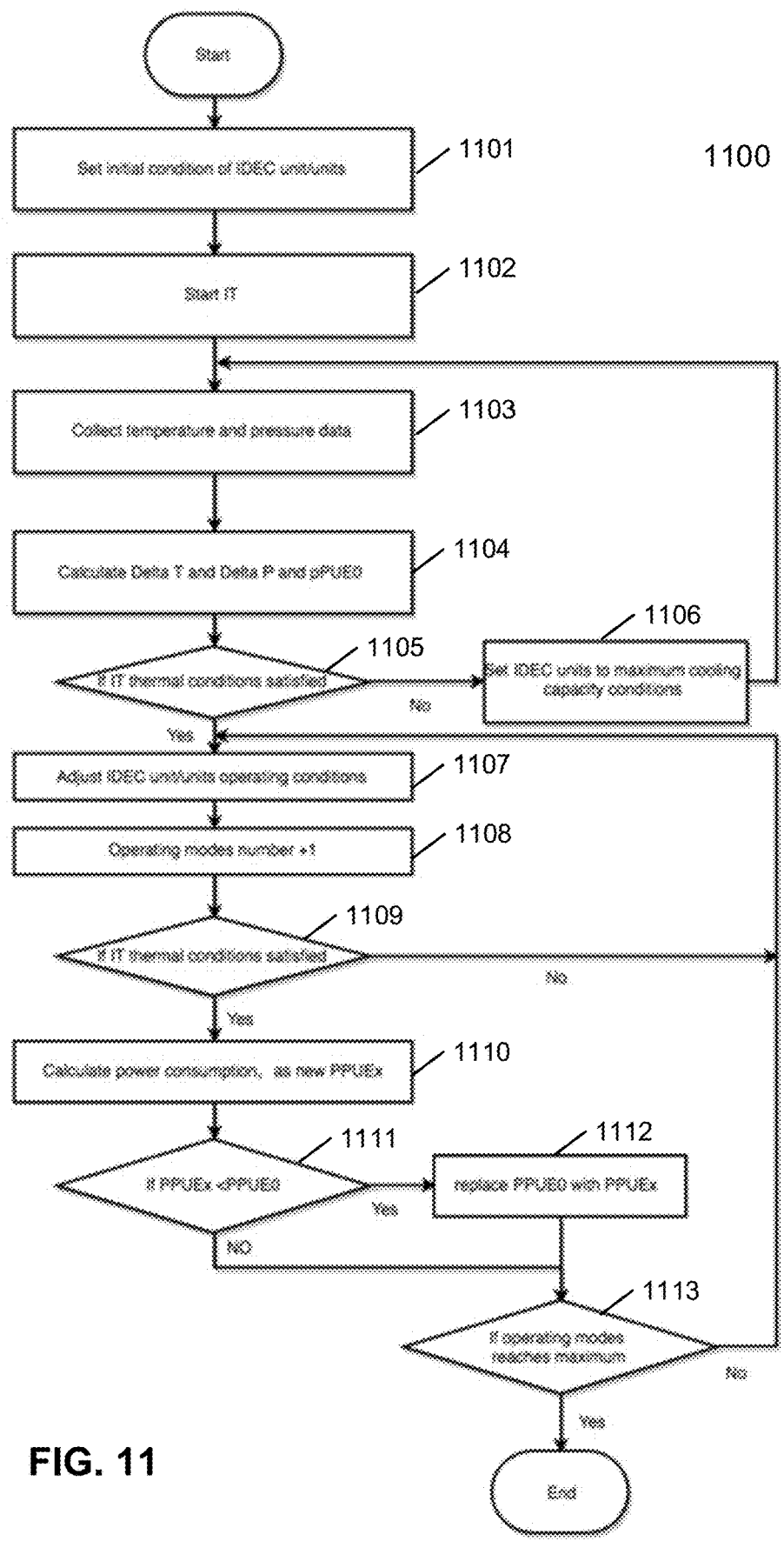
FIG. 11 is a flow diagram illustrating a thermal management process of a data center system according to another embodiment.

FIG. 11 is a flow diagram illustrating an optimization process for determining an optimal cooling unit operating conditions for a data center at certain IT workload condition according to one embodiment. Process 1100 may be performed by processing logic which may include software, hardware, or a combination thereof. For example, process 1100 may be performed by control system 300. Referring to FIG. 11, in operation 1101, an IDEC unit is configured according to the initial settings and the electronic racks are turned on in operation 1102. In operation 1103, the sensor data is collected from the sensors such as temperature sensors and pressure sensors. In operation 1104, the sensor data is analyzed to determine the operating environment of the data center such as temperature and power consumption, etc. A partial power usage effectiveness (PPUE) value is set to an initial optimal PPUE value. Operation 1105 is to designed for safety operating. Before the system optimization process, it needs to be ensured that the IT room thermal environment requirement is satisfied.

Power usage effectiveness (PUE) is a ratio that describes how efficiently a computer data center uses energy; specifically, how much energy is used by the computing equipment (in contrast to cooling and other overhead). An ideal PUE is 1.0. Anything that is not considered a computing device in a data center (i.e. lighting, cooling, etc.) falls into the category of facility energy consumption.

Referring back to FIG. 11, in operation 1105, it is determined whether the thermal conditions satisfy the IT room requirement, where the predetermined condition may be compatible with the industry standard for a particular type of data center or a particular IT workload condition. If the thermal condition does not satisfy the IT requirement, in operation 1106, the IDEC unit is configured to be set to the maximum cooling capacity condition (e.g., the thermal environment with the lowest possible temperature), and the above operations 1103-1105 are iteratively performed. The rationale behind is that we would ensure the data center is operating in an acceptable thermal environment before optimizing the operating parameters of the IDEC unit.

Once the IT thermal condition has been satisfied in operation 1105, the IDEC unit operating conditions are adjusted in operation 1107 for each of the operating condition candidates in operation 1108 (e.g., condition candidates as shown in FIG. 10). In operation 1109, it is determined whether the IT thermal condition is still satisfied. If not, a next operating condition or a next set of operating parameters of the IDEC unit is selected and the above operations 1107-1108 are iteratively performed. If the IT thermal condition has been satisfied in operation 1109, the new or current PPUE value is calculated based on the current settings of the IDEC unit in operation 1110. In operation 1111, it is determined whether the current PPUE value is lower than the optimal PPUE value. If so, in operation 1112, the optimal PPUE value is updated and set to the current PPUE value of the current iteration. In addition, the current set of operating modes or operating parameters of the IDEC unit are designated as an optimal set of operating modes or operating parameters for the IDEC unit, which may be stored in a persistent storage device such as a hard disk of control system 300. The above operations are iteratively performed until all of the operating mode/parameter candidates (e.g., candidates as shown in FIG. 10) have been processed in operation 1113.

Once the optimal set of operating parameters of the IDEC unit has been determined via the above iterative processes, the IDEC unit can then be configured according to the optimal set of operating parameters. In one embodiment, process 1100 may be performed periodically (e.g., during initial start or reboot of the data center) to find the optimal set of operating parameters at the point in time, as the operating environment of the data center, such as the workload, may change from time to time.

In this design, PPUE which is a metrics for cooling energy consumption are considered as the criteria for the optimal process, in another embodiment, water usage effectiveness, or combined water usage effectiveness and PPUE can be used as alternative criterias.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the disclosure also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present disclosure are not described with reference to any particular programming language. It will be appreciated that a variety of programming languages may be used to implement the teachings of embodiments of the disclosure as described herein.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A data center system, comprising:
   an information technology (IT) room to contain a plurality of electronic racks, each electronic rack having a plurality of IT components therein;
   a cold air room adjacent to a first side of the IT room to receive cold air of an internal airflow from an indirect evaporative cooling (IDEC) unit and to distribute the cold air to the electronic racks to exchange heat generated from the IT components, wherein the cold air room includes a first set of at least one or more temperature sensors to sense a temperature of the cold air room;
   a hot air room disposed adjacent to a second side of the IT room to receive hot air carrying the heat exchanged from the electronic racks and to return the hot air to the IDEC unit; and
   a control system coupled to at least a portion of the at least one or more temperature sensors of the first set, wherein the control system is configured to
      in response to sensor data from the temperature sensors of the first set, analyze the sensor data based on a first set of thermal management rules wherein analyzing the sensor data comprises iteratively adjusting at least one or more operating parameters and determining whether the first set of thermal management rules are satisfied, and
      transmit at least one or more control signals to the IDEC unit to modify the at least one or more operating parameters of the IDEC unit based on the analysis to provide an optimal thermal environment for operating the IT components of the electronic racks.

2. The data center system of claim 1, wherein the hot air room comprises a second set of temperature sensors to sense a temperature of the hot air room, wherein the control system is configured to analyze sensor data received from the temperature sensors of the second set, and wherein the at least one or more control signals are generated further base on the analysis on the second set of temperature sensors.

3. The data center system of claim 1, wherein in analyzing the sensor data, the control system is configured to
   calculate an average temperature of the cold air room based on temperature data obtained from the temperature sensors of the first set,
   compare the average temperature with a first predetermine temperature threshold, and
   in response to determining that the average temperature is greater than the first predetermined temperature threshold, the control system is configured to increase a fans speed of a first set of at least one or more fans of the IDEC unit responsible for circulating an external airflow to exchange heat with the internal airflow received from the hot air room.

4. The data center system of claim 3, wherein the control system is further configured to activate an evaporative pump of the IDEC unit to spray liquid onto external air to lower a temperature of the external airflow.

5. The data center system of claim 3, wherein the control system is further configured to activate a direct expansion (DX) system of the IDEC unit to lower a temperature of the external air flow.

6. The data center system of claim 3, wherein the control system is further configured to
   compare the average temperature with a second predetermined temperature threshold, and
   decrease the fans speed of the at least one or more fans of the first set, in response to determining that the average temperature is below the second predetermined temperature threshold.

7. The data center system of claim 6, wherein the control system is further configured to deactivate an evaporative pump of the IDEC unit to stop spraying liquid onto external air.

8. The data center system of claim 6, wherein the control system is further configured to deactivate a direct expansion (DX) system of the IDEC unit.

9. The data center system of claim 1, wherein the cold air room further comprises a first set of at least one or more pressure sensors to sense an air pressure of the internal airflow in the cold air room, and wherein the control system is configured to adjust a distribution of the internal airflow entering the IT room from the cold air room based on air pressure data obtained from the pressure sensors of the first set.

10. The data center system of claim 9, wherein the hot air room further comprises a second set of pressure sensors to sense an air pressure of the internal airflow in the hot air room, and wherein the distribution of the internal airflow is adjusted further based on air pressure data obtained from the pressure sensors of the second set.

11. The data center system of claim 10, wherein the control system is configured to modify a fans speed of a second set of at least one or more fans of the IDEC unit to adjust a flow volume of the internal airflow based on the air pressure data obtained from the first set and second set of pressure sensors.

12. The data center system of claim 9, wherein the control system is configured to
   calculate an average pressure of the internal airflow based on pressure data obtained from the pressure sensors, compare the average pressure against a predetermined pressure threshold, and adjust an opening ratio of a louver interfacing the cold air room and the IT room to adjust a flow volume of the internal airflow entering the IT room based on the comparison.

13. The data center system of claim 12, wherein the louver comprises a plurality of louvers and the first set of pressure sensors comprises a plurality of subsets of pressure sensors, each of the subsets of pressure sensors being associated with one of the louvers, wherein each subset of pressure sensors is utilized to measure a flow volume of the internal airflow flowing through a corresponding louver.

14. A method of thermal management of a data center system, the method comprising:

receiving, by a control system, sensor data from a plurality of temperature sensors disposed within a cold air room adjacent to an information technology (IT) room of a data center system, the IT room including a plurality of electronic racks, wherein the cold air room is configured to receive cold air from an indirect evaporative cooling (IDEC) unit and to distribute the cold air to travel through an airspace of the electronic racks to exchange heat generated from the electronic racks to reach an hot air room adjacent to the IT room, wherein the hot air room is configured to return hot air carrying the exchanged heat back to the IDEC unit;

performing an analysis on the sensor data based on a first set of thermal management rules, and transmitting one or more control signals to the IDEC unit to modify one or more operating parameters of the IDEC unit based on the analysis to provide an optimal thermal environment for operating IT components of the electronic racks.

15. The method of claim 14, wherein the hot air room comprises a second set of temperature sensors to sense a temperature of the hot air room, wherein the control system is configured to analyze sensor data received from the temperature sensors of the second set, and wherein the one or more control signals are generated further base on the analysis on the second set of temperature sensors.

16. The method of claim 14, wherein performing an analysis on the sensor data comprises:

calculating an average temperature of the cold air room based on temperature data obtained from the temperature sensors of the first set;

comparing the average temperature with a first predetermine temperature threshold; and increasing a fans speed of a first set of one or more fans of the IDEC unit responsible for circulating an external airflow to exchange heat with the internal airflow received from the hot air room, in response to determining that the average temperature is greater than the first predetermined temperature threshold.

* * * * *